United States Patent [19]

Cho et al.

[11] 4,028,627

[45] June 7, 1977

[54] SAMPLE AND HOLD VALLEY DETECTOR

[75] Inventors: Susumu Cho, Elk Grove Village; Paul Milton Erickson, Oak Park; Michael William Null, Schaumburg, all of Ill.

[73] Assignee: Motorola, Inc., Schaumburg, Ill.

[22] Filed: Dec. 29, 1975

[21] Appl. No.: 645,003

[52] U.S. Cl. .......................... 325/349; 179/1 MN; 325/304
[51] Int. Cl.² .................................................. H04B 1/16
[58] Field of Search .............. 325/56, 67, 304–306, 325/349, 363, 484, 487, 478; 179/1 P, 1 MN

[56] References Cited

UNITED STATES PATENTS

| | | | |
|---|---|---|---|
| 3,238,457 | 3/1966 | Boymel et al. | 325/67 |
| 3,729,681 | 4/1973 | Elder | 325/304 |
| 3,729,682 | 4/1973 | Elder | 325/304 |

Primary Examiner—Robert L. Griffin
Assistant Examiner—Jin F. Ng
Attorney, Agent, or Firm—James W. Gillman; Eugene A. Parsons; Victor Myer

[57] ABSTRACT

An audio signal quality detector connected to receive an audio signal from the discriminator of a radio receiver and including an envelope detector connected to the output of the discriminator and supplying a signal indicative of the envelope of the audio to a resettable valley detector which stores a voltage indicative of the lowest valley applied thereto subsequent to a reset pulse and a sample and hold gate connected to the valley detector for sampling the voltage stored in the valley detector prior to periodic reset pulses applied to the valley detector. Circuitry is also included for inhibiting the operation of the sample and hold gate when there is no output from the valley detector.

8 Claims, 2 Drawing Figures

SAMPLE AND HOLD VALLEY DETECTOR

BACKGROUND OF THE INVENTION

1. Field of the Invention

In audio signal quality detectors and the like utilized, for example, in voting or receiver selecting systems, it is necessary to determine which receiver of a plurality of receivers is provided the best signal, i.e. which receiver is receiving the strongest or best quality of signal. It is well known that the discriminator in an FM receiver provides a noise signal that is inversely proportional to the strength or quality of the signal being received. Thus, if the noise level at the output of the discriminator can be determined, the receiver receiving the strongest or best quality of signal can be determined also. To determine the noise level, the output of the discriminator must be constantly monitored to select valleys in the audio signal and determine the noise level in the valley.

2. Description of the Prior Art

U.S. Pat. No. 3,729,682, entitled "Audio Signal Quality Indicating Circuit", issued Apr. 24, 1973, discloses a prior art system wherein an inverted peak detector having a relatively long time constant is utilized as a valley detector to constantly monitor valleys in the envelope of the audio signal from a discriminator. Because this prior art valley detector has a flat attack and slow decay, when a good signal suddenly fades deeply, the system is not capable of quickly switching to another receiver.

SUMMARY OF THE INVENTION

The present invention pertains to sample and hold valey detector means in an audio signal quality detector connected to receive an audio signal from the discriminator of a radio receiver. The sample and hold valley detector means includes envelope detector means having connected thereto resettable valley detector means including storage means with a fast attack and no decay, sample and hold gate means connected to the valley detector means for sampling the voltage stored in the storage means of the valley detector means each time the gate is triggered, and clock means providing first periodic pulses and second periodic pulses delayed from the first periodic pulses, said first periodic pulses being utilized to operate the gate in the sample and hold gate means and the second pulses being utilized to reset the valley detector means after each sample has been taken.

It is an object of the present invention to provide sample and hold valley detector means for use in an audio signal quality detector.

It is a further object of the present invention to provide sample and hold valley detector means including a resettable valley detector with fast attack and substantially no decay.

It is a further object of the present invention to provide sample and hold valley detector means wherein the sampling of the output is inhibited when the audio signal applied thereto does not provide an envelope signal voltage lower than a prescribed value.

It is a further object of the present invention to provide sample and hold valley detector means for use in an audio signal quality detector which appreciably improves switching time when a good signal suddenly fades deeply.

These and other objects of this invention will become apparent to those skilled in the art upon consideration of the accompanying specification, claims and drawings.

BRIEF DESCRIPTION OF THE DRAWINGS

Referring to the drawings.

DESCRIPTION OF THE PREFERRED EMBODIMENT

Figure 1:
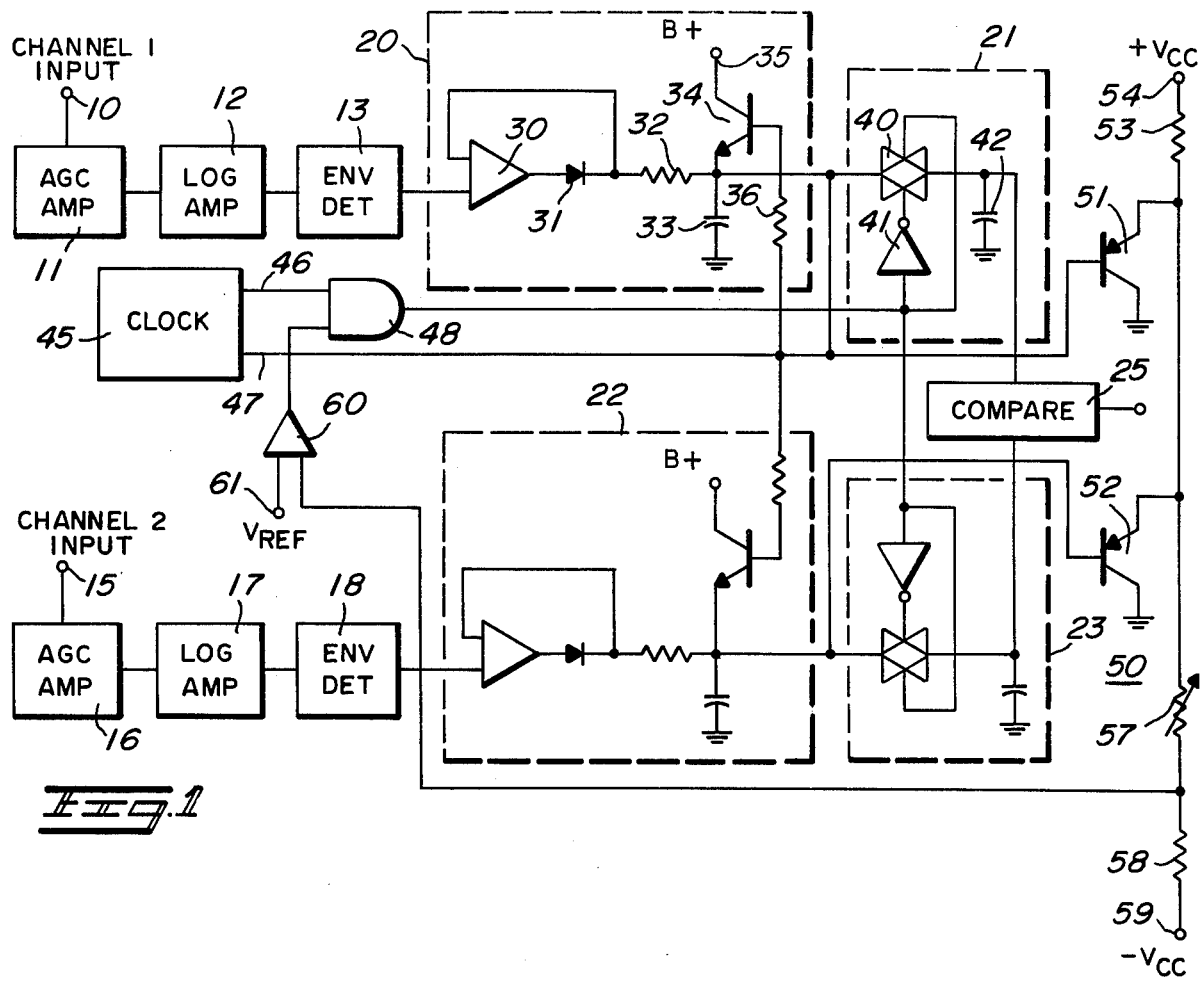
FIG. 1 is a schematic diagram of a sample and hold valley detector constructed in accordance with the present invention.

Referring specifically to FIG. 1, a first input terminal 10 is adapted to be connected to receive the audio output from a discriminator of an FM radio receiver (not shown) by some connecting link, such as telephone lines or the like. The audio at input terminal 10 is applied to an automatic gain control amplifier 11 the output of which is applied to a logarithmic amplifier 12. The output of the logarithmic amplifier 12 is applied to an envelope detector 13. Similarly, a second input terminal 15 is adapted to be connected to receive the audio output of the discriminator of a second FM radio and applies the audio to an automatic gain control amplifier 16 with the output thereof being applied to a logarithmic amplifier 17. The output of the logarithmic amplifier 17 is applied to an envelope detector 18. It should be understood that only two channels are shown in this embodiment but any number of channels desired might be utilized.

The automatic gain control amplifiers, logarithmic amplifiers and envelope detectors are utilized to operate on the audio signals to insure that all of the outputs of the radio receivers are similarly acted upon and that the variations thereof are within predetermined limits. Also the envelope detector supplies a signal varying in accordance with the peaks of the audio signal. Circuits of this type and the operation thereof are described in a copending application entitled "A Receiver Voting System", Ser. No. 604,562, filed. Aug. 14, 1975, and a co-pending application entitlted "Audio Quality Control Indicator", Ser. No. 645,002, filing date Dec. 29, 1975 both of which are assigned to the same present assignee.

The output of the envelope detector 13 is applied to an input of a resettable valley detector 20 and the output thereof is applied to sample and hold gate means 21. Similarly, the output of the envelope detector 18 is applied to a resettable valley detector 22 and the output thereof is applied to sample and hold gate means 23. The outputs of the sample and hold gate means 21 and 23 are applied to a comparator circuit 25, which selects the lowest output from either of the two channels. The operation of the comparator circuit 25 is also described in the above-referenced co-pending applications. Since the resettable valley detectors 20 and 22 are identical and the sample and hold gate means 21 and 23 are identical, only the resettable valley detector 20 and the sample and hold gate means 21 are illustrated in detail.

The input of the resettable valley detector 20 is connected to the negative or inverting input of an operational amplifier 30 having an output connected to the cathode of a diode 31. The anode of the diode 31 is connected to one side of a resister 32 and to the positive or non-inverting input of the operational amplifier 30. The other side of the resistor 32 provides the output of the resettable valley detector 20 and is connected to one side of a storage capacitor 33, the other side of which is grounded, and to the emitter of an N-P-N type transistor 34. The collector of the transistor 34 is connected to a terminal 35 having a positive source of voltage connected thereto (not shown) and the base of the transistor 34 is connected through a resistor 36 to a reset input.

In the operation of the resettable valley detector 20, a positive reset pulse is applied to the base of the transistor 34 causing conduction thereof. The storage capacitor 33 quickly charges to approximately the value of the voltage applied to the terminal 35 and remains at this value. When the audio envelope is applied to the operational amplifier 30, the capacitor 33 discharges through the resistor 32, diode 31 and operational amplifier 30 until the voltage stored therein is equal to the lowest value of the audio envelope applied to the input of the operational amplifier 30. The discharge time of the capacitor 33, or the attack time of the circuit, is relatively fast because the value of the resistor 32, in this embodiment, is only 30 ohms. Thus, the value of the voltage stored in the capacitor 33 rapidly discharges to the value of the input audio envelope each time a lower valley is applied. Because the charge on the storage capacitor 33 rapidly reduces to the lowest amplitude of the signal applied to the input and retains that value until another reset pulse is applied to the base of transistor 34, this circuit is referred to as a fast attack, no decay circuit. When the next reset pulse is applied to the base of the transistor 34, the capacitor 33 again charges to approximately the value of the B+ applied to the terminal 35 and a new cycle begins.

The voltage across the capacitor 33 is applied to a signal input of an electronic gate circuit 40. A trigger input is connected to a first input of the gate 40 and through an invertor 41 to a second input of the gate 40. A signal output of the gate 40 is connected to one side of a storage capacitor 42, the other side of which is connected to ground. The voltage across the storage capacitor 42 forms the output for the sample and hold gate means 21. The gate 40 is not disclosed in detail since it is a commercially available item and may be purchased, for example, from Motorola, Inc. under the number MC14016AL. In the operation of the sample and hold gate means, the gate 40 simply opens when a trigger pulse is applied to the input of the invertor 41 and remains open as long as the pulse is present. When the gate 40 is open the capacitor 42 quickly charges to the value of the capacitor 33. In the present embodiment, the capacitor 42 has a value of approximately 0.2 microfarads while the capacitor 33 has a value of approximately 2 microfarads so that the voltage in the capacitor 33 can be quickly sampled by the capacitor 42 with substantially no effect thereon.

Figure 2:
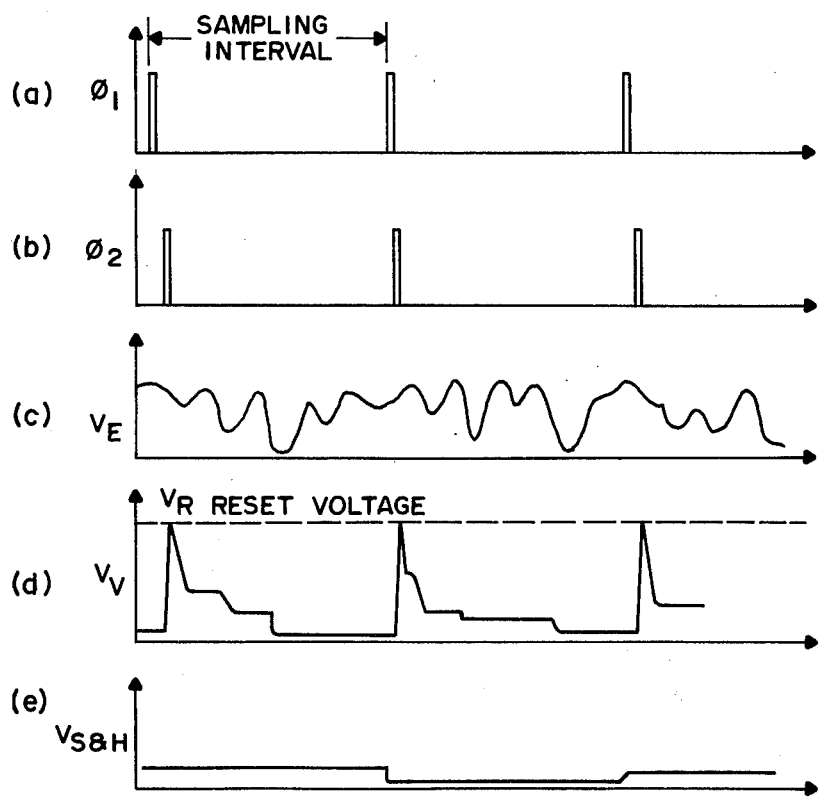
FIG. 2 illustrates a series of wave forms available at various points in the schematic diagram of FIG. 1.

A clock 45, which is some form of oscillatory circuit such as a multivibrator or the like, provides first periodic pulses on a first output 46 and second periodic pulses on a second output 47. The second periodic pulses may be the same as the first periodic pulses but delayed a short time interval therefrom. The first periodic pulses available at the output 46 are illustrated in wave form (a) of FIG. 2 and the second periodic pulses are illustrated in wave form (b). In the present embodiment the time interval from the leading edge of one of the first pulses to the leading edge of the subsequent pulse, referred to as a sampling interval, is approximately 400 milliseconds. The first pulses at the output 46 of the clock 45 are applied through an AND, or inhibit, gate 48 to the trigger inputs of the sample and hold gate means 21 and 23. The second pulses at the output 47 of the clock 45 are applied to the reset input of the resettable valley detectors 20 and 22. Wave form (c) of FIG. 2 illustrates a typical audio envelope as it appears at the output of the envelope detector 13. Wave form (d) of FIG. 2 illustrates the voltage wave form across the capacitor 33, or the output of the resettable valley detector 20, and wave form (e) illustrates the voltage across the capacitor 42, or the output of the sample and hold gate means 21. It should be noted that a trigger pulse is applied to the sample and hold gate means 21 to sample the voltage available across the capacitor 33 just prior to the application of a reset pulse to the reset input of the resettable valley detector 20. Thus, for each sampling inteval the voltage at the output of the sample and hold gate means 21 is indicative of the lowest amplitude of the signal applied to the input of the resettable valley detector 20 during that sampling interval. Since the resettable valley detector 20 is reset periodically, the time which the comparator 25 may connect the wrong receiver or channel to the output, in case of a sudden fade in a good signal, will never be greater than the sampling interval. Thus, the present circuit substantially improves over the prior art circuits which incorporate a slow decay of several seconds. While the present embodiment utilizes a sampling interval of 400 milliseconds, it should be understood that longer or shorter sampling intervals might be provided if desired, depending upon the application.

Sensing means, generally designated 50 are provided for determining when none of the channels has a valley signal lower than a prescribed value. The output of the resettable valley detector 20 is connected directly to the base of a PNP type transistor 51. Similarly the output of the resettable valley detector 22 is connected directly to the base of a second PNP type transistor 52. The collectors of the transistors 51 and 52 are grounded and the emitters are connected together through a resistor 53 to a terminal 54 having a positive voltage source (not shown) applied thereto. The emitters are also connected through an adjustable resistor 57 and a fixed resistor 58 to a terminal 59 having a negative voltage souce (not shown) connected thereto. When none of the channels has a valley signal lower than a prescribed value applied thereto, the output of the resettable valley detectors 20 or 22 holds its present value. As for the operation of the transistors 51 or 52, either of the transistors 51 or 52 with a lower base voltage conducts to reduce the voltage at the junction of the resistors 57 and 58. However, this voltage remains at a more positive value than the reference voltage when the valley signal is above the prescribed value. This positive voltage is applied to the inverting input of an operational amplifier 60, the non-inverting input of which is connected to a terminal 61 having a reference voltage source (not shown) connected thereto. The output of the operational amplifier 60 is connected to a second input of the AND gate 48. When the voltage at the inverting input of the operational amplifier 60 is a positive value relative to the voltage at the terminal 61, a negative signal is applied to the second input of the AND gate 48 to inhibit the application of the first pulses from the output 46 of the clock 45 to the trigger inputs of the sample and hold gate means 21 and 23. Thus, the sampling ceases and no new signals are applied to the comparator 25. It is essential that the sampling cease when no channel is receiving a valley signal lower than a prescribed value in order to assure accuracy in voting of receivers.

Thus, a sample and hold valley detector is disclosed which provides an appreciably more accurate signal quality indiction under Rayleigh fading conditions or when a good signal suddenly fades deeply. While we have shown and described a specific embodiment of this invention, further modifications and improvements will occur to those skilled in the art. We desire to be understood, therefore, that this invention is not limited to the particular form shown and we intend in the appended claims to cover all modifications which do not depart from the spirit and scope of this invention.

We claim:

1. An audio signal quality detector comprising sample and hold valley detector means connected to receive an audio signal from the discriminator of a radio receiver, said sample and hold valley detector means comprising:
   a. envelope detector means providing an output signal varying in accordance with peaks of the audio signal;
   b. resettable valley detector means having an output, a signal input and a reset input for returning signals at the output to a predetermined level when a reset signal is applied to the reset input, said valley detector means including storage means for storing a signal indicative of the lowest valley applied to the signal input thereof subsequent to the last reset signal applied thereto, and the signal input of said valley detector means being coupled to receive the output signal from said envelope detector means;
   c. sample and hold gate means having a signal input, an output and a rigger input for operating said gate means to store a signal indicative of the amplitude of a signal present at the signal input when a trigger signal is applied to the trigger input, said signal input being coupled to the output of said valley detector means; and
   d. clock means having a first output connected to the reset input of said valley detector means and having a second output connected to the sample and hold gate means trigger input, said clock means supplying first periodic pulses at the first output and second periodic pulses, delayed from the first periodic pulses, at the second output.

2. Sample and hold valley detector means as claimed in claim 1 wherein the sample and hold gate means includes a storage capacitor and a normally closed electronic gate coupling said storage capacitor to the storage means in the resettable valley detector means when a trigger signal is applied to said electronic gate.

3. Sample and hold valley detector means as claimed in claim 1 wherein the resettable valley detector means comprises a circuit having a relatively fast attack time and substantially no decay.

4. Sample and hold valley detector means as claimed in claim 1 including in addition clock disable means for inhibiting at least the first periodic pulses from the clock means with no valley signal lower than a prescribed value.

5. Sample and hold valley detector means as claimed in claim 4 wherein the clock disable means includes inhibit gate means connected between the first output of the clock means and the trigger input of the sample and hold gate means and sensing means connected to said inhibit gate means and the output of the resettable valley detector means for sensing an output signal from said valley detector means.

6. Sample and hold valley detector means as claimed in claim 1 wherein the resettable valley detector means includes an operational amplifier.

7. Sample and hold valley detector means as claimed in claim 6 wherein the storage means includes a storage capacitor coupled to the output of the operational amplifier.

8. Sample and hold valley detector means as claimed in claim 7 wherein the resettable valley detector means includes a transistor connected to the storage capacitor for discharging the capacitor during conduction of the transistor.

* * * * *